(12) United States Patent
Huang et al.

(10) Patent No.: US 7,804,076 B2
(45) Date of Patent: Sep. 28, 2010

(54) INSULATOR FOR HIGH CURRENT ION IMPLANTERS

(75) Inventors: James Huang, Jhudong Township, Hsinchu County (TW); Yung-Cheng Kuo, Jhudong Township, Hsinchu County (TW); Min-Kung Hsu, Jhubei (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 406 days.

(21) Appl. No.: 11/382,600

(22) Filed: May 10, 2006

(65) Prior Publication Data

US 2007/0262270 A1    Nov. 15, 2007

(51) Int. Cl.
*H01J 37/317*    (2006.01)
(52) U.S. Cl. .................. 250/492.21; 174/179; 428/447
(58) Field of Classification Search ............. 250/492.21
See application file for complete search history.

(56) References Cited

U.S. PATENT DOCUMENTS

| | | | | |
|---|---|---|---|---|
| 2,668,187 A | * | 2/1954 | Von Wald, Jr. et al. ... | 174/153 A |
| 3,812,284 A | * | 5/1974 | Pohl ........................... | 174/188 |
| 3,955,091 A | * | 5/1976 | Robinson et al. ......... | 250/423 R |
| 4,760,262 A | * | 7/1988 | Sampayan et al. ....... | 250/423 R |
| 4,891,525 A | * | 1/1990 | Frisa et al. ............... | 250/423 R |
| 5,521,389 A | * | 5/1996 | Kim ....................... | 250/423 R |
| 6,777,882 B2 | * | 8/2004 | Goldberg et al. ........ | 315/111.81 |
| 6,838,664 B2 | * | 1/2005 | Sakairi et al. ............... | 250/288 |
| 7,443,088 B2 | * | 10/2008 | Lykowski .................... | 313/123 |
| 2003/0146707 A1 | | 8/2003 | Goldberg et al. | |

* cited by examiner

*Primary Examiner*—David A. Vanore
*Assistant Examiner*—Phillip A. Johnston
(74) *Attorney, Agent, or Firm*—Duane Morris LLP

(57) ABSTRACT

An insulator usable in high current ion implantation systems includes increased surface due to the configuration of an inner cylinder and an outer cylinder coupled to the inner cylinder at one end. A cylindrical cavity extends between the two cylinders increasing the surface area and making the insulator resistant to being coated by a coating that could produce a leakage path.

18 Claims, 5 Drawing Sheets

INSULATOR FOR HIGH CURRENT ION IMPLANTERS

FIELD OF THE INVENTION

This invention relates to an ion beam source head and extraction assembly used in an ion implantation system used for the implantation of ions into substrates such as semiconductor wafers. More particularly, the invention relates to an improved insulator used in the source head to insulate high voltage components from low voltage components.

BACKGROUND

Ion implantation techniques for modifying the electrical conductivity properties of semiconductor materials are well known. In order to generate the ions necessary for implantation into the semiconductor wafer, an ion source is provided which generates ions of a chosen element. An extraction assembly comprising a plurality of electrodes is provided downstream of the ion source to extract, accelerate and focus the ions before they enter a mass analyzer and selector and reach the wafer.

U.S. Pat. No. 6,777,882 B2 describes such an ion beam generator apparatus. The contents of U.S. Pat. No. 6,777,882 B2 are hereby incorporated by reference as if set forth in their entirety. FIG. 1 shows an exemplary extraction assembly 11 for generating ion beam 30 and directing the same to a semiconductor wafer disposed in a grounded end station (not shown). Each of extraction, suppression and ground electrodes 23, 24 and 25 respectively, include apertures through which the ion beam extends in this exemplary arrangement. Each of the apertured electrodes 23, 24 and 25 comprise a single electrically-conductive plate having an aperture through the plate to allow ion beam 30 emerging from ion source 20 to pass through. The ion source head includes ion source 20 and arc chamber 20A and is maintained by a voltage supply at a positive voltage relative to ground for a positive ion beam. The energy of the ion beam emerging from the extraction assembly is determined by the voltage supplied to the ion source. A typical value for this voltage is 20 KV, providing an extracted beam energy of 20 keV. Other extracted beam energies, such as beam energies of 80 keV and higher, may be used in other arrangements. Suppression electrode 24 is biased by a supplied voltage with a negative potential relative to ground. For a beam of positive ions, extraction electrode 23 is maintained by a voltage supply at a potential below the potential of the ion source, i.e. source electrode 22, so as to extract the positive ions from the ion source. The potential of extraction electrode 23 would typically be below the potential of the suppression electrode 24 for a low energy beam, and above the potential of suppression electrode 24 for a high energy beam.

The biased extraction electrode 23 is separated from ion source 20 by insulator 44 which contacts both the biased extraction electrode 23 and ion source 20 which is held at the same potential as source electrode 22. In other arrangements, insulators such as insulator 44 can be used to insulate various other high voltage components from ground or other low voltage components.

Such insulators, including insulator 44, can become coated by the gas containing the ion beam and which emanates from ion source 20 and can migrate throughout the extraction assembly and source head. When the surface of insulator 44 becomes coated, the resistance of the insulator decreases and a leakage path is produced between the components it is intended to insulate, in the illustrated example, extraction electrode 23, and ion source 20. This causes the beam current of ion beam 30 to become unstable and eventually requires replacement of extraction assembly 11 in order to maintain performance of the overall ion implantation system.

It would therefore be desirable to provide an insulator that is resistant to becoming coated and providing a leakage path such as that necessitates replacement of the source head components.

SUMMARY OF THE INVENTION

To address these and other needs, and in view of its purposes, the present invention provides an improved insulator for an ion implantation system having an ion source maintained at a high electric potential, a grounded end station adapted for holding wafers (i.e., substrates) and a plurality of extraction electrodes accelerating the ions from the source and directing an ion beam onto the wafers of the end station, in one aspect. The improvement comprises the insulator disposed between a first high voltage component and a second component being a lower voltage component or a component maintained at ground. The insulator comprises an inner cylindrical body surrounded by an outer cylindrical body with a gap therebetween. The outer cylindrical body has opposed ends, one of the ends radially coupled to the inner cylindrical body.

In another aspect, the insulator is disposed within an apparatus having a chamber with a first component maintained at a high electric potential and proximate to a second component desirably maintained at a lower potential or ground, and with an ionic gas present therein. The insulator is disposed between and physically contacting each of the first and second components. The insulator comprises an inner cylindrical body concentrically surrounded by an outer cylindrical body with a gap therebetween. The outer cylindrical body has opposed ends, one of the ends radially coupled to the inner cylindrical body by a flange extending circumferentially around the inner cylindrical body.

In another aspect, provided is an insulator for insulating a first component maintained at a high electrical potential from a second component desirably maintained at ground in an ionic gaseous environment. The insulator comprises an inner cylindrical body having opposed ends disposed between and physically contacting each of the first and second components, the inner cylindrical body concentrically surrounded by an outer cylindrical body with a gap therebetween and the outer cylindrical body having opposed ends, one of the ends radially coupled to the inner cylindrical body by a flange extending circumferentially around the inner cylindrical body.

BRIEF DESCRIPTION OF THE DRAWING

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

Provided is an insulator that insulates a high voltage component bias at a high potential from a further low voltage component maintained at ground or at a significantly lower potential level. The inventive insulator finds particular applicability for use in an ion source head in an ion implantation system, particularly a high current ion implantation system used in the semiconductor manufacturing industry. In this application the inventive insulator may insulate an electrode, electrode bar or high voltage line maintained at a high potential from another electrode or other component desirably maintained at ground, or at a considerably lower potential. The inventive insulator also finds application in various other tools and systems used in various industries and in which a high voltage potential is to be insulated from a ground or low voltage component. The inventive insulator is resistant to becoming coated with a coating that can cause shorting from the high voltage component to ground when the coating completely coats the surface of the insulator.

Figure 1:
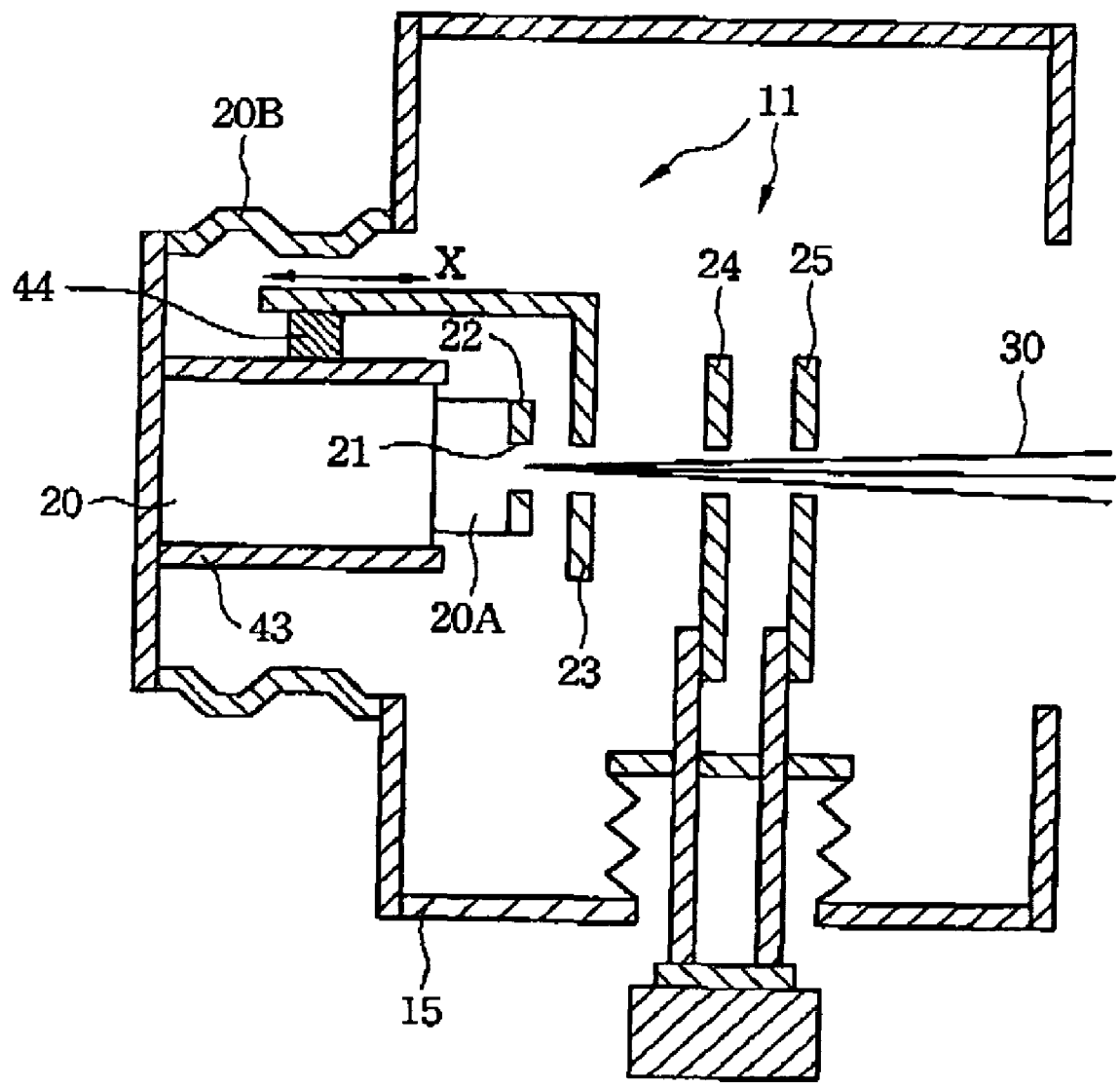
FIG. 1 is a plan view of an exemplary ion beam generator according to the PRIOR ART.

The insulator may be used, for example, as insulator 44 in an ion implantation system such as shown in FIG. 1, though the insulator is not limited to use in conjunction with the illustrated exemplary system, or within ion implantation systems in general.

Figure 2:
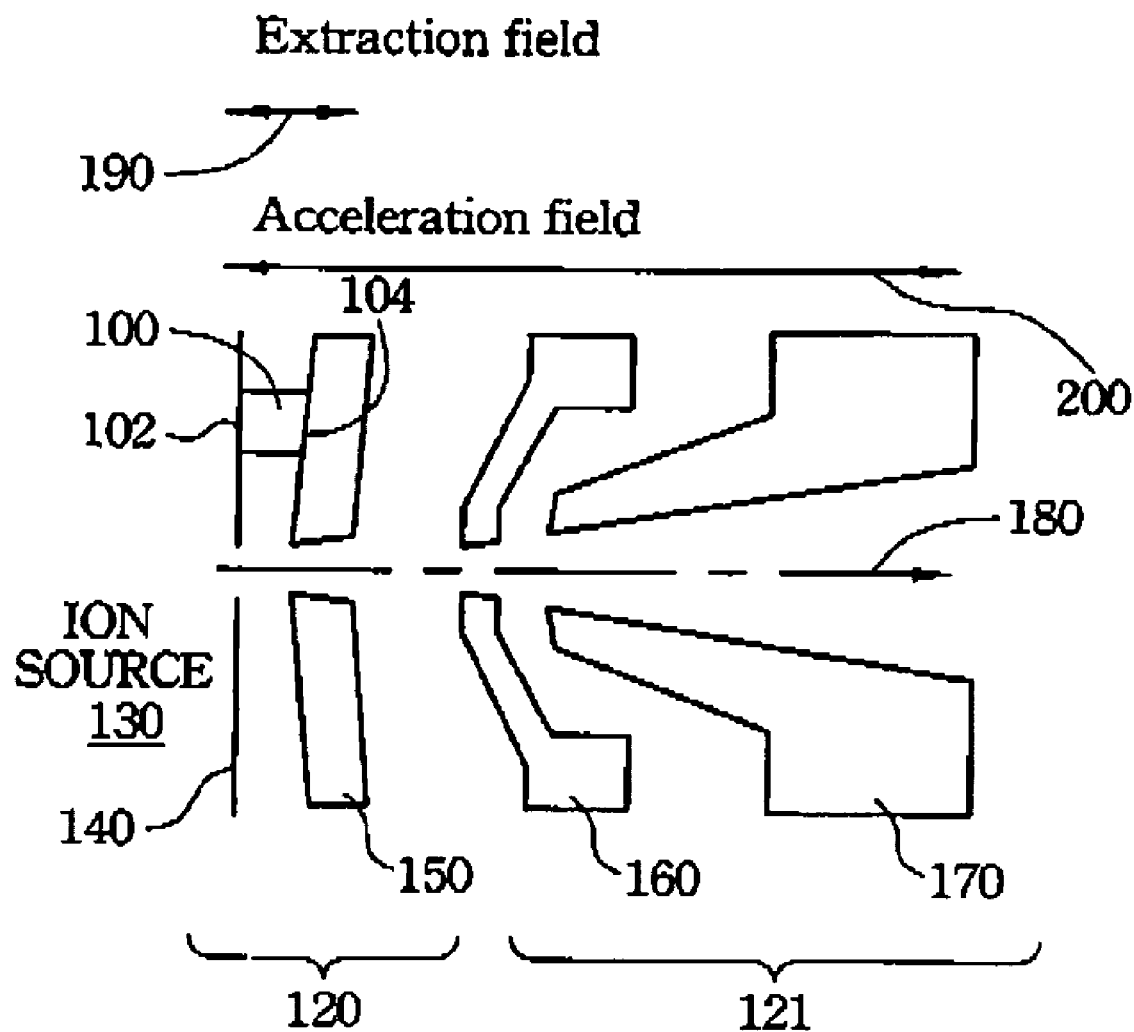
FIG. 2 is a schematic of an ion implanter source head and extraction assembly including the insulator of the invention.

FIG. 2 shows a more general assembly within which the inventive insulator may be used. FIG. 2 shows an exemplary arrangement of extraction assembly 121 and source head 120 within which inventive insulator 100 may be used. Within source head 120 is ion source 130 with G1 arc chamber slit 140, and G2 extraction electrode 150. Extraction assembly 121 includes G3 suppression electrode 160 and G4 ground electrode 170. In one exemplary embodiment, both G3 suppression electrode 160 and G4 ground electrode 170 are maintained at ground potential. Together, the source head and extraction assembly produce ion beam 180. Extraction field 190 including G1 arc chamber slit 140 and G2 extraction electrode 150 sets the beam current of ion beam 180. The beam energy is set by acceleration field 200 which includes each of G1 arc chamber slit 140, G2 extraction electrode 150, G3 suppression electrode 160, and G4 ground electrode 170. G1 arc chamber slit 140 may be maintained at a positive electric potential and electric potential of G2 extraction electrode 150 may be held below the potential of the ion source—G1 arc chamber slit 140 so as to extract positive ions from ion source 130. In one exemplary embodiment, G2 extraction electrode 150 may be maintained at a potential of about −2 kV to about −30 kV less than G1 arc chamber slit 140.

Insulator 100 with opposed ends 102 and 104 is disposed between G1 arc chamber slit 140 and G2 extraction electrode 150 in the illustrated arrangement which is exemplary only. Insulator 100 may be used in various other locations and applications. Arrangements such as shown in FIG. 2 may be used in AMAT-Applied Materials, Inc. high current implanters, for example. Applied Materials, Inc. is located in Santa Clara, Calif. Insulator 100 may alternatively be used in various other tools that require isolation between high voltage and low voltage or ground. For example, other high current implanters and high energy implanters may utilize the insulator of the invention.

Figure 3:
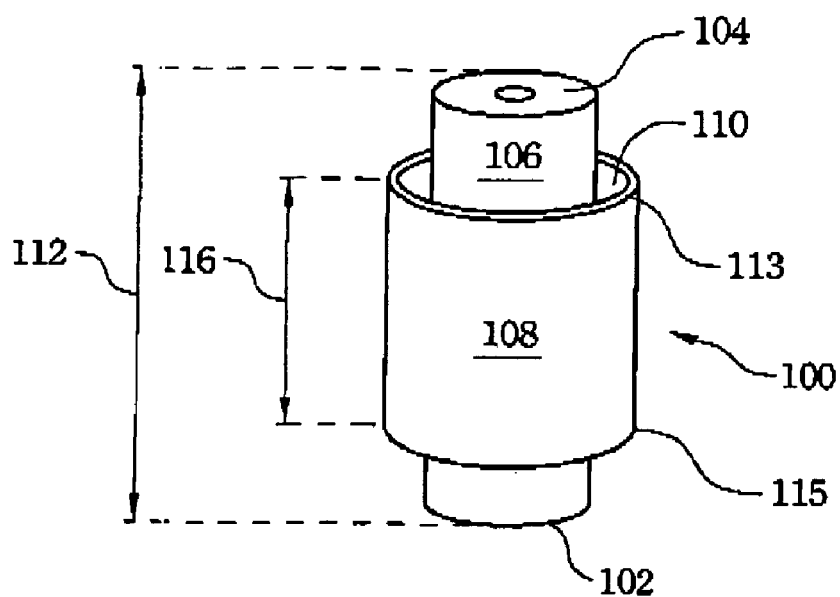
FIGS. 3 and 4 are perspective views of an exemplary insulator according to the invention.
Figure 4:
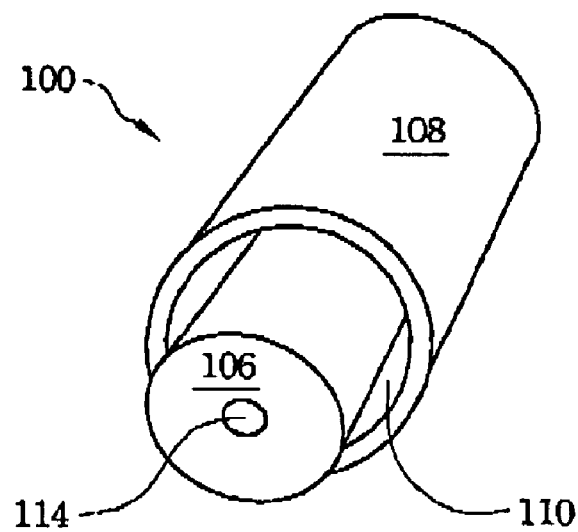

FIGS. 3 and 4 show perspective views of the exemplary insulator of the invention. The insulator may be formed of conventional materials such as primarily $Al_2O_3$ but other materials may be used in other exemplary embodiments. In one exemplary embodiment, insulator 100 may be formed of 99.7% $Al_2O_3$. Insulator 100 includes increased surface area with respect to conventional insulators of a given length such as length 112 and therefore, when disposed in a gap of a given size between a high voltage and ground or low voltage component, the increased surface area is less likely to be completely coated to form a leakage path. The increased surface area itself decreases the possibility of a continuous coating being formed thereon. Moreover, the design geometry includes surfaces not outwardly exposed to gas in the environment and additionally makes it difficult for a film or coating to be formed continuously from opposed ends of insulator 100.

Insulator 100 includes opposed ends 102 and 104 and is formed of inner cylinder 106 and outer cylinder 108. Opposed ends 102, 104 typically are in physical contact with the respective components they are insulating. Referring to FIGS. 3 and 4, inner cylinder 106 and outer cylinder 108 are concentric in the illustrated embodiment. Other arrangements may be used in other exemplary embodiments. Concentric cylindrical cavity 114 extends inwardly to a depth from each of opposed ends 102. In other exemplary embodiments, concentric cylindrical cavity 114 may not be present. Length 116 of outer cylinder 108 is less than length 112 of inner cylinder 106. The illustrated exemplary embodiment is intended to be just that—exemplary, and in other arrangements, lengths 112 and 116 may be almost the same and in yet other exemplary embodiments, length 116 may be relatively smaller than length 112. Gap 110 is a cylindrical cavity formed between outer cylinder 108 and inner cylinder 106. Radial thickness of inner cylinder 106 is greater than that of outer cylinder 108. Outer cylinder 108 includes opposed ends 113 and 115. At end 115, inner cylinder 106 and outer cylinder 108 are radially joined by a flange disposed between inner cylinder 106 and outer cylinder 108. The flange may be continuous so that inner cylinder 106 is completely circumferentially joined to outer cylinder 108 such that the cavity formed within gap 110 is open at one end (113) and closed at the other end (115). In the illustrated embodiment, outer cylinder 108 is spaced a fixed distance from inner cylinder 106 making gap 110 of uniform distance.

Figure 5A:
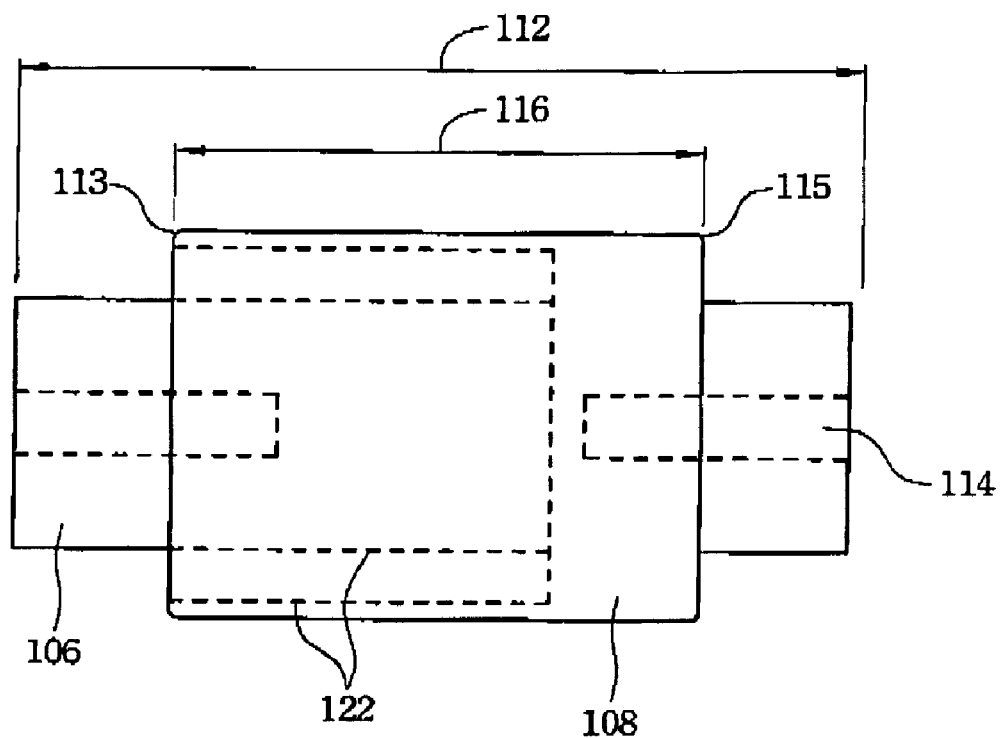
FIGS. 5A and 5B are schematic drawings showing side and end views of an exemplary insulator of the invention.
Figure 5B:
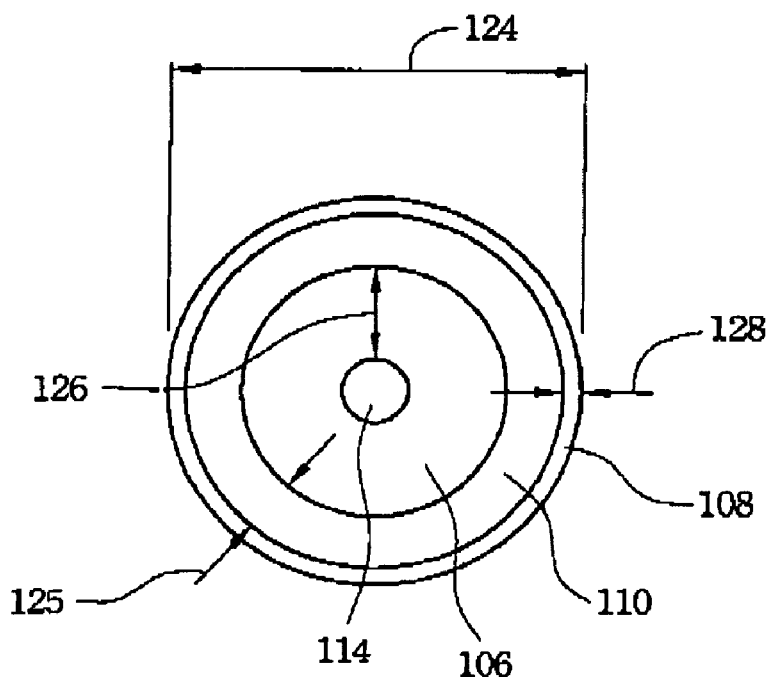

FIGS. 5A and 5B are engineering schematic diagrams showing side and end views of an exemplary insulator of the invention, respectively. As shown in the side view of FIG. 5A, length 112 of inner cylinder 106 may be 50 centimeters in one exemplary embodiment but may be formed to any of various lengths as determined by the spacing between the components that insulator 100 will be used to insulate. In one exemplary embodiment, length 116 may be about 31 centimeters when length 112 is 50 centimeters, but other relative dimensions and other absolute dimensions may be used depending on the configuration of the system within which insulator 100 is being used. Length 116 of outer cylinder 108 may be at least 60% of length 112 of inner cylinder 106 in an advantageous embodiment.

FIG. 5B is a plan, end view showing relative radial dimensions of inner and outer cylinders 106 and 108, respectively. Radial thickness 126 of inner cylinder 106 is greater than corresponding radial thickness 128 of outer cylinder 108 of the exemplary embodiment, but in other exemplary embodiments, the relative radial thicknesses may vary. In one exemplary embodiment, radial thickness 126 may be four times as great as radial thickness 128 but other relative thickness may be used in other embodiments depending on the design of the source head. Thickness 125 of gap 110 is advantageously maintained at a small value making it more difficult for gas present in the source head to enter the cavity of gap 110 and form a continuous coating on the surfaces that define the cavity. Referring again to FIG. 5A, it can be seen that in order for a leakage path to be formed from one end of insulator 100 to the other, a continuous coating must be formed on all outer surfaces as well as on inner surfaces 122 (shown in dashed lines) of gap 110. The outer diameter 124 of insulator 100 may take on various values and one exemplary embodiment may be around 25 centimeters.

The dimensions of insulator 100 will vary to accommodate the particular location in which insulator 100 will be used. Opposed ends 102 and 104 of insulator 100 are advantageously physically coupled to the elements of different electric potential between which the insulator provides insulation. One exemplary arrangement is shown in FIG. 6.

Figure 6:
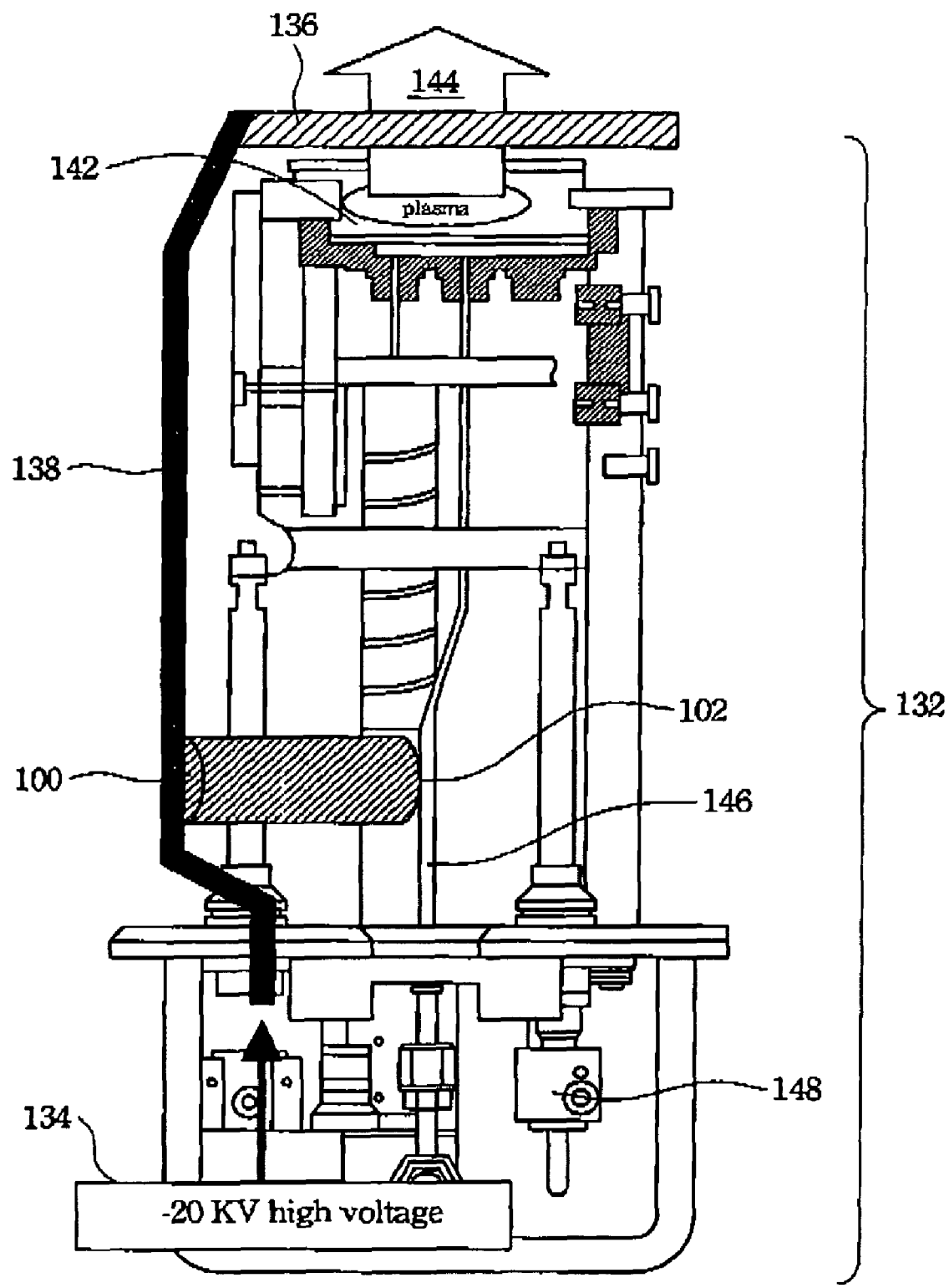
FIG. 6 is a side view of an exemplary source head including an insulator according to the invention.

Source head 132 shown in FIG. 6 illustrates another exemplary arrangement in which insulator 100 may be used. In the illustrated exemplary embodiment, high voltage 134 is supplied to G2 graphite electrode 136 by means of electrode bar 138. In one exemplary embodiment, high voltage 134 may be the illustrated −20 KV but in other exemplary embodiments other voltages may be used. G2 graphite electrode 136 may be maintained at a greater negative potential than G1 arc chamber 142, for example G2 graphite electrode 136 may be maintained at a potential −2 kV to −30 kV greater than G1 arc chamber 142. Arc chamber (G1) 142 generates plasma that is extracted by electrode 136 to produce exiting plasma 144 which will be later focused into an ion beam. Source head 132 also includes filament electrode 148 and gas supply piping 146. Insulator 100 is disposed between high potential electrode bar 138 and any location in the source head held at the G1 potential, providing insulation therebetween. In an exemplary embodiment, insulator 100 may be disposed between high potential electrode bar 138 and gas supply piping 146. According to the illustrated arrangement, end 102 of insulator 100, i.e the end adjacent closed end 115 of outer cylinder 108 (as shown in FIGS. 3 and 5A, for example) may be oriented inwardly, contacting gas supply piping 146. In other arrangements, insulator 100 may be positioned such that open end 113 (see FIGS. 3 and 5A) is distally positioned with respect to the gas flow anticipated within source head 132. This further diminishes the possibility that gas will completely fill gap 110 for an extended time to form a continuous coating on the surfaces thereof. It is an advantage of the inventive insulator 100 that electrode bar 138 is sufficiently insulated from gas supply piping 146 (and vice versa) with an insulator 100 that is resistant to having a leakage path formed thereacross. Insulator 100 therefore prevents leakage between electrode bar 138 and ground components and extends source head life with no additional costs. The beam current remains stable for improved yield and extensive monitoring of the system, or frequent changing of source head parts, is not necessary.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. In an ion implantation system having an ion source maintained at a high electric potential, a grounded end station adapted for holding substrates and a plurality of extraction electrodes accelerating the ions from a source head and directing an ion beam onto the substrates of the end station, the improvement comprising:
    an insulator disposed between a first component being a high voltage component and a second component being a lower voltage component or a component maintained at ground,
    the insulator comprising an inner cylindrical body surrounded by an outer cylindrical body with a gap therebetween, said inner cylindrical body oriented such that its axis extends from said first component to said second component, and
    the outer cylindrical body having opposed ends, one of the ends radially coupled to the inner cylindrical body,
    wherein the inner cylindrical body is longer than the outer cylindrical body and includes opposed end faces, each in confronting relation with and contacting and terminating at an exterior of a respective one of said first and second components and wherein each of said first and second components comprise electrodes, and
    wherein the insulator comprising the inner cylindrical body and the outer cylindrical body is a single uninterrupted and inseparable unit and the inner cylindrical body includes an axially central portion being completely diametrically solid.

2. In the ion implantation system of claim 1, wherein a length of the outer cylindrical body is at least 60% of a length of the inner cylindrical body.

3. In the ion implantation system of claim 1, wherein the inner cylindrical body and the outer cylindrical body are concentric.

4. In the ion implantation system of claim 1, wherein the gap comprises a cylindrical cavity.

5. In the ion implantation system of claim 1, wherein a radial thickness of the inner cylindrical body is greater than a radial thickness of the outer cylindrical body.

6. In the ion implantation system of claim 1, wherein the potential difference between the first and second components is at least about 20 kV.

7. In the ion implantation system of claim 1, wherein the inner cylindrical body is circumferentially coupled to the outer cylindrical body such that the gap has an open end and a closed end and the insulator is disposed within the source head and the closed end is disposed closer to the ion beam than the open end.

8. In the ion implantation system of claim 7, wherein the insulator is disposed within the source head and a first end of the opposed ends contacts the first component and the first end is closest to the closed end of the outer cylindrical body.

9. In the ion implantation system of claim 1, wherein the axis of the insulator is disposed orthogonal to a direction of the ion beam.

10. In the ion implantation system of claim 1, wherein the outer cylindrical body is spaced a constant distance from the inner cylindrical body.

11. In the ion implantation system of claim 1, wherein the other of the opposed ends of the outer cylindrical body is spaced from the inner cylindrical body by the gap.

12. In an apparatus having a chamber with a first component maintained at a high electric potential and proximate to a second component maintained at a lower electric potential and an ionic gas present therein, the improvement comprising:
   an insulator disposed between the first and second components,
   the insulator comprising an inner cylindrical body concentrically surrounded by an outer cylindrical body with a gap therebetween, the inner cylindrical body including an axially central portion being completely diametrically solid and positioned such that its cylindrical axis extends from the first component, to the second component and having opposed end faces in confronting relation with and physically contacting and terminating at an exterior of each of the first and second components, respectively, each said opposed end face including a radial surface,
   the outer cylindrical body having opposed ends, only one of the ends radially coupled to the inner cylindrical body by a flange extending circumferentially around the inner cylindrical body.

13. In the apparatus of claim 12, wherein the outer cylindrical body includes a length at least about 60% of a length of the inner cylindrical body.

14. An insulator for insulating a first component maintained at a high electric potential from a second component desirably maintained at ground in an ionic gaseous environment, the insulator comprising an inner cylindrical body interposed between the first and second components and oriented such that its cylindrical axis extends from the first component to the second component, the inner cylindrical body concentrically surrounded by an outer cylindrical body with a gap therebetween and the outer cylindrical body having opposed ends, one of the ends radially coupled to the inner cylindrical body by a flange extending circumferentially around the inner cylindrical body,
   wherein the inner cylindrical body includes an axially central portion being completely diametrically solid and opposed end faces that include a radial surface facing, contacting and terminating at an exterior of a respective one of the first and second components.

15. The insulator as in claim 14, wherein a length of the outer cylindrical body is at least 60% of a length of the inner cylindrical body.

16. In the apparatus of claim 12, wherein the insulator is a single uninterrupted and inseparable unit.

17. In the apparatus of claim 12, wherein each of the first and second components comprise electrodes.

18. The insulator as in claim 14, wherein the insulator is a single uninterrupted and inseparable unit.

* * * * *